(12) United States Patent
Sengupta

(10) Patent No.: US 9,590,635 B1
(45) Date of Patent: Mar. 7, 2017

(54) PARTIAL RECONFIGURATION OF PROGRAMMABLE DEVICES

(71) Applicant: Altera Corporation, San Jose, CA (US)

(72) Inventor: Shayan Sengupta, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/958,303

(22) Filed: Dec. 3, 2015

(51) Int. Cl.
*H03K 19/177* (2006.01)

(52) U.S. Cl.
CPC . *H03K 19/17756* (2013.01); *H03K 19/17744* (2013.01)

(58) Field of Classification Search
CPC ......... G06F 13/4221; G06F 2213/0024; G06F 2213/0026
USPC ........................ 326/37–41, 47; 710/313–315
See application file for complete search history.

(56) References Cited

U.S. PATENT DOCUMENTS

| 7,535,254 | B1* | 5/2009 | Case ............... H03K 19/17732 326/39 |
| 8,145,894 | B1* | 3/2012 | Casselman .......... G06F 15/7871 713/1 |
| 8,917,111 | B1* | 12/2014 | Puranik ............ H03K 19/17748 326/38 |
| 9,257,987 | B1* | 2/2016 | Molson ............ H03K 19/17756 |
| 2012/0036306 | A1* | 2/2012 | Miyoshi ................ G06F 13/102 710/316 |
| 2015/0109024 | A1* | 4/2015 | Abdelfattah ..... H03K 19/01758 326/41 |
| 2015/0121060 | A1* | 4/2015 | Mimms ............... G06F 13/4282 713/100 |
| 2015/0178235 | A1* | 6/2015 | Kanigicherla ...... G06F 13/4027 710/314 |
| 2016/0062424 | A1* | 3/2016 | Thomas .................... G06F 1/24 710/313 |

* cited by examiner

*Primary Examiner* — Jason M Crawford
(74) *Attorney, Agent, or Firm* — Fletcher Yoder, P.C.

(57) ABSTRACT

Techniques and mechanisms disclosed herein provide a partial reconfiguration bitstream for a region of configurable logic of a programmable logic device over a communications interface such as the Peripheral Component Interconnect Express (PCIe) protocol.

20 Claims, 6 Drawing Sheets

PARTIAL RECONFIGURATION OF PROGRAMMABLE DEVICES

TECHNICAL FIELD

This disclosure generally relates to partial reconfiguration of programmable devices.

DESCRIPTION OF THE RELATED TECHNOLOGY

A programmable logic device (PLD) includes logic circuitry and routing that may be configured to perform a variety of logic functions. In a typical scenario, a designer uses electronic design automation (EDA) tools to create a design. These tools use information regarding the hardware capabilities of the PLD to help the designer implement logic functions using multiple resources available on the PLD by determining the configuration of configuration elements to set up the logic circuitry to implement the desired functionality. A bitstream indicating states of the configuration elements can be generated by the EDA tool and provided to the PLD to configure the configuration elements so that the functionality is implemented.

Portions of the PLD can be partially reconfigured to provide new functionality while other portions of the PLD are capable of providing existing functionality. The partially reconfigured portions can be reconfigured using a partial reconfiguration bitstream indicating the states of the configuration elements in the portion to be reconfigured. However, storing the partial reconfiguration bitstreams on the PLD can reduce the amount of memory available for other applications.

SUMMARY

The systems, methods and devices of this disclosure each have several innovative aspects.

One innovative aspect of the subject matter described in this disclosure can be implemented in a bridge circuit of a programmable logic device (PLD) to receive a first configuration data from a communications interface, the first configuration data indicating states of configurable elements of a region of the configurable logic to implement a first functionality, the bridge circuit to freeze inputs and outputs of the region of the configurable logic, and the bridge circuit to provide bits of the first configuration data to a control block of the PLD to configure the configurable elements after freezing the inputs and outputs.

In some implementations, the bridge circuit is to adjust a clock signal used by the control block based on a rate of the first configuration data being provided over the communications interface.

In some implementations, the communications interface conforms to a Peripheral Component Interconnect Express (PCIe) protocol.

In some implementations, the configurable elements indicated in the first configuration data correspond to a subset of configuration elements of the configurable logic of the PLD.

In some implementations, the bridge circuit is further to receive a second configuration data from the communications interface, the second configuration data indicating states of the configurable elements of the region to implement a second functionality.

In some implementations, the bridge circuit is further to provide an identifier corresponding to the region to the control block.

In some implementations, the bridge circuit is further to extract bits from the first configuration data to provide a partial reconfiguration bitstream corresponding to the configuration elements of the region to the control block.

In some implementations, the bridge circuit is further to receive status data from the control block and provide the status data on the communications interface to a host device.

Another innovative aspect of the subject matter described in this disclosure can be implemented in a method for partial reconfiguration of a programmable logic device (PLD), the method comprising: receiving, by a bridge circuit of the PLD, from a communication interface providing communications between the PLD and a host device, an indication that a portion of configurable logic of the PLD is to be reconfigured; freezing, by the bridge circuit, inputs and outputs of the portion of the configurable logic of the PLD; receiving, by the bridge circuit, data providing a partial reconfiguration bitstream for the portion of the configurable logic of the PLD that is to be reconfigured; and providing, by the bridge circuit, the partial reconfiguration bitstream for the portion of the configurable logic of the PLD to a control block for reconfiguring the portion of the configurable logic.

In some implementations, reconfiguring configurable elements of the portion of the configurable logic of the PLD based on the partial reconfiguration bitstream.

In some implementations, the configurable elements indicated in the partial reconfiguration bitstream correspond to a subset of configuration elements of the configurable logic of the PLD.

In some implementations, the method includes adjusting a frequency of a clock signal used by the control block based on a rate of receiving the data providing the partial reconfiguration bitstream.

In some implementations, the communications interface conforms to a Peripheral Component Interconnect Express (PCIe) protocol.

In some implementations, the method includes extracting bits from the data to provide the partial reconfiguration bitstream.

Another innovative aspect of the subject matter described in this disclosure can be implemented in a system including a bridge circuit to receive configuration data from a host device, the configuration data indicating states of configurable elements of a region of configurable logic to implement a first functionality, the bridge circuit to freeze inputs and outputs of the region of the configurable logic; and a control circuit to receive a bitstream from the configuration data to configure the configurable elements of the region, bits in the bitstream corresponding to the states of the configuration elements of the region of the configurable logic.

In some implementations, the bridge circuit is to adjust a clock signal used by the control circuit based on a rate of the configuration data being received.

In some implementations, the configurable elements indicated in the configuration data correspond to a subset of configuration elements of the configurable logic of a PLD including the bridge circuit and the control circuit.

In some implementations, the bridge circuit communicates with the host device with a communications interface conforming to a Peripheral Component Interconnect Express (PCIe) protocol.

In some implementations, the bridge circuit is further to receive status data from the control circuit and provide the status data on the communications interface to the host device.

In some implementations, the bridge circuit is further to provide an identifier corresponding to the region to the control circuit.

DETAILED DESCRIPTION OF PARTICULAR EMBODIMENTS

This disclosure describes techniques for implementing partial reconfiguration of a programmable logic device (PLD), such as a field programmable gate array (FPGA), complex programmable logic device (CPLD), and other semiconductor devices. In some scenarios, a system environment can include a host device that can provide a partial reconfiguration bitstream to reconfigure a portion of the configurable logic of a PLD. The partial reconfiguration bitstream can be provided over a high-speed communications interface, such as the Peripheral Component Interconnect Express (PCIe) protocol. The PLD can include an IP block as a bridge circuit that can handle the data provided over the PCIe communications interface and provide the bitstream data to a control block of the PLD that can use the bitstream data to partially reconfigure a portion of the PLD. The IP block can also "freeze" the inputs and outputs of the portion of the configurable logic that is to be reconfigured and adjust a clock signal provided to the control block based on the bitstream being provided to the IP block by the host device via the PCIe communications interface.

In more detail, in some scenarios, bitstreams can be stored in flash memory within PLD 110, or within configurable logic 160 of PLD 110. However, storing several bitstreams within PLD 110 can occupy resources that would otherwise be available for other logical functionality and uses, reducing the capabilities of PLD 110.

Figure 1:
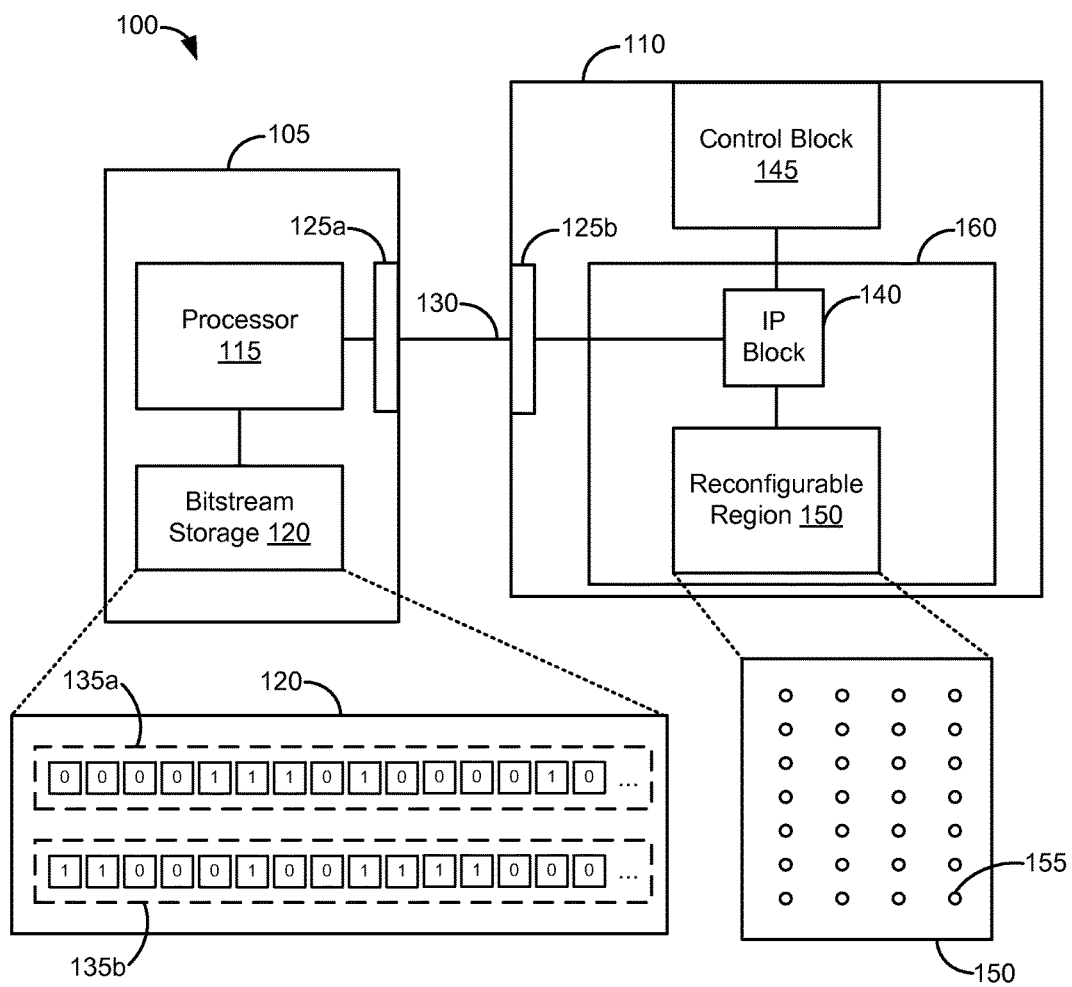
FIG. 1 illustrates an example of a system for partial reconfiguration.

FIG. 1 illustrates an example of a system for partial reconfiguration. Rather than storing several partial reconfiguration bitstreams within PLD 110, partial reconfiguration bitstreams can be stored by host device 105 and provided to PLD 110 when needed, as discussed below. Accordingly, more resources of PLD 110 can be available for other functionalities and uses.

System 100 in FIG. 1 includes host device 105 (e.g., a computer, on-board system integrated a processor and memory with PLD 110, etc.) providing data to PLD 110 that can be used to reconfigure reconfigurable region 150. Host device 105 and PLD 110 can communicate (i.e., provide and receive data in both directions) over PCIe communications interface 130 using PCIe endpoints 125a and 125b, respectively. Host device 105 can be, for example, a desktop computer, an on-board system sharing a board with PLD 110, etc. In FIG. 1, IP block 140 is implemented within configurable logic 160, but in other implementations it may be implemented as an application specific integrated circuit (i.e., "hard" logic). Likewise, in other implementations, control block 145 may be implemented within configurable logic 160.

PLD 110 includes PCIe endpoint 125b that receives data over PCIe communications interface 130, configurable logic 160 having reconfigurable region 150, control block 145 which can reconfigure reconfigurable region 150 using a partial reconfiguration bitstream provided in the data received at PCIe endpoint 125b, and IP block 140 which can act as a bridge between PCIe endpoint 125b and control block 145.

PLD 110 can include configurable logic 160 (or "soft" logic) that can be configured, or programmed, to provide specific functionality based on the partial reconfiguration bitstream received at PCIe endpoint 125b. Configurable logic 160 can include configuration elements 155 (e.g., SRAM, flash, anti-fuses, fuses, etc.) that can be programmed or configured in different states to implement different logical functionality within configurable logic 160. Different combinations of states of configurable elements can result in different logical functionality provided within configurable logic 160.

Reconfigurable region 150 can be a portion, or subset, of configurable logic 160 of PLD 110 that can be reconfigured. That is, PLD 110 can partially reconfigure its configurable logic 160 by reconfiguring reconfigurable region 150 (i.e., changing the states of some of the configuration elements of reconfigurable region 150 such that it provides a different logical functionality, as further discussed below) while the rest of its configurable logic 160 is still maintained and operating by providing logic functionality based on the previously-provided states of configuration elements of the rest of the configurable logic 160.

PLD 110 can use a bitstream to configure states of the configuration elements of configurable region 160 to provide logic functionality. The bitstream can be received by IP block 140, which can process the data of the bitstream and provide it to control block 145 which can then reconfigure configurable logic 160. A bitstream corresponding to reconfigurable region 150 (i.e., fewer bits than a bitstream for configuring all of configurable logic 160) can be used to partially reconfigure reconfigurable region 150. For example, the bitstream can indicate whether a configuration element should be configured as a "1" or a "0" (e.g., store a corresponding value in an SRAM cell, program an anti-fuse in a corresponding state, etc.). A specific position of a bit in the partial reconfiguration bitstream can correspond to a specific configuration element 155 of reconfigurable region 150. Accordingly, control block 145 can configure each configuration element 155 based on the bit indicating the state it should be configured in corresponding to its position within the partial reconfiguration bitstream.

IP block 140 can receive the partial reconfiguration bitstream at PCIe endpoint 125b and initiate a process with control block 145 to begin the partial reconfiguration process. As discussed in more detail later herein, IP block 140 can "freeze" the inputs and outputs of reconfigurable region 150 by preventing the toggling of its inputs and outputs as it is being partially reconfigured by control block 145 to avoid data corruption within reconfigurable region 150 as well as the rest of configurable logic 160 (i.e., the portion that is not being partially reconfigured).

Host device 105 includes processor 115 and bitstream storage 120. Bitstream storage 120 can be a storage medium, such as a hard drive, flash memory, or other type of memory that can store bitstreams such as bitstreams 135a and 135b.

Bitstreams 135a and 135b provide bits indicating states of configuration elements 155 of reconfigurable region 150 of PLD 110, as previously discussed. That is, bitstreams 135a and 135b can be used by PLD 110 to configure reconfigurable region 150 to provide particular functionality based on the states of the bits (i.e., 1 or 0) in bitstreams 135a and 135b. As a result, because bitstreams 135a and 135b indicate different states for configuration elements 155, bitstreams 135a and 135b can configure reconfigurable region 150 to provide different functionality. For example, bitstream 135a may provide the states for configuration elements 155 to be configured such that the logical elements and routing of reconfigurable region 150 provide the functionality of a cryptography algorithm. Bitstream 135b may provide the states for configuration elements 155 to be configured such that the logic elements and routing of reconfigurable region 150 provide the functionality of a compression algorithm. The rest of configurable logic 160 may provide the functionality of a communications system. As a result, if the communications system implemented by configurable logic 160 needs to use the cryptography algorithm, reconfigurable region 150 can be reconfigured using bitstream 135a to provide the functionality of the cryptography algorithm. If the communications system subsequently needs to use the compression algorithm, reconfigurable region 150 can be reconfigured such that the functionality that it provides witches from the cryptography algorithm to the compression algorithm using bitstream 135b. In some implementations, PLD 110 can provide a signal indicating that reconfigurable region 150 should be changed to one of the other algorithms, and therefore, host device 105 can provide the appropriate bitstream from bitstream storage 120.

Processor 115 of host device 105 can obtain bitstreams 135a and 135b from bitstream storage 120 and provide it to PCIe endpoint 125a for transmission to PLD 110 using PCIe communications interface 130. The bitstreams can be received at PCIe endpoint 125b of PLD 110, which can then be provided to IP block 140. IP block 140 can process the data of the bitstreams, as discussed below, and provide the bitstream data to control block 145 to partially reconfigure configurable logic 160 by reconfiguring the configuration elements 155 of reconfigurable region 150 based on the bitstream data.

By storing partial reconfiguration bitstreams within bitstream storage 120 of host device 105 rather than within PLD 110, more resources of PLD 110 may be available for other uses. For example, more of configurable logic 160 might be available to implement logic functionality.

Figure 2:
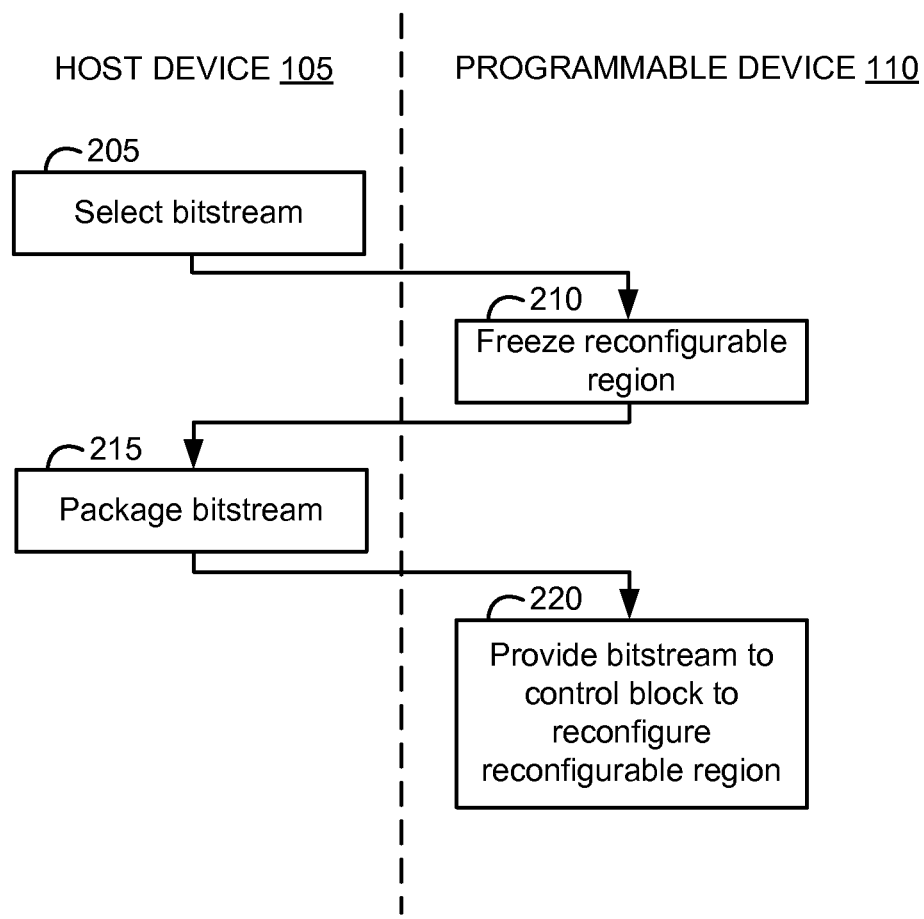
FIG. 2 is a flowchart illustrating a process flow for partial reconfiguration in accordance with some implementations.

FIG. 2 is a flowchart illustrating a process flow for partial reconfiguration in accordance with some implementations. In FIG. 2, at block 205, a partial reconfiguration bitstream can be selected by host device 105 to provide to PLD 110. For example, a designer can provide a command through a command prompt to provide a specific partial reconfiguration bitstream, host device 105 may determine that PLD 110 should partially reconfigure reconfigurable region 150 (e.g., based on monitoring PLD 110), or host device 105 may receive a command from another component (including PLD 110, or another device) to provide a partial reconfiguration bitstream. Accordingly, processor 115 of host device 105 can select one of bitstreams 135a and 135b to provide to PCIe communications interface 130 via PCIe endpoint 125a to provide the selected bitstream to PLD 110.

As a result, host device 105 can provide a signal via PCIe communications interface 130 that it is ready to provide one of partial reconfiguration bitstreams 135a or 135b. At block 210, IP block 140 can receive the signal from PCIe endpoint 125b and "freeze" the reconfigurable region that is to be reconfigured based on the selected partial reconfiguration bitstream. For example, if partial reconfiguration bitstream 135a is selected to be used to reconfigure reconfigurable region 150, then IP block 140 can assert a freeze signal, or flag, to logic implemented at the inputs and outputs of reconfigurable region 150 such that changes of signals at the inputs of reconfigurable region 150 are not propagated (i.e., the inputs to reconfigurable region 150 are not toggling) through reconfigurable region 150 while it is to be reconfigured, and changes at outputs of reconfigurable region 150 are likewise not propagated through the rest of configurable logic 160. That is, the data at the inputs and outputs at the boundaries of reconfigurable region 150 can be frozen, or asserted at a static high or low logic level, during the partial reconfiguration process. In one example, AND gates may be provided at the inputs and outputs of reconfigurable region 150 with an input of each AND gate receiving the freeze signal (e.g., a low logic signal so that the output of each AND gate is a low logic level). This may be useful to avoid corruption of the reconfiguration of reconfigurable region 150, as well as avoiding improper data to be propagated from reconfigurable region 150 as it is being reconfigured (resulting in potentially random outputs due to logic being reconfigured) to the other logic implemented by configurable logic 160. IP block 140 can also provide a signal to control block 145 indicating that it should prepare to receive a bitstream to partially reconfigure PLD 110.

After the reconfigurable region is frozen, PLD 110 can provide a signal to host device 105 that it is ready to receive a partial reconfiguration bitstream to reconfigure the region. Accordingly, at block 215, the selected partial reconfiguration bitstream can be "packaged" to be provided to PLD 110 for use in partial reconfiguration of reconfigurable region 150. For example, host device 105 may process the bits of partial reconfiguration bitstream 135a or 135b to be provided over PCIe communications interface 130 in accordance with the PCIe protocol and in a manner in which the bits can be used by control block 145 to reconfigure reconfigurable region 150. In some implementations, processor 115 can select the appropriate partial reconfiguration bitstream from bitstream storage 120 can provide the bits of the bitstream in "chunks," or groupings of bits, at a time over PCIe communications interface 130. For example, 32 bits of the bitstream may be provided at a time. In some implementations, each chunk of the bitstream may be provided on PCIe communications interface 130 with a corresponding address within an address range associated with IP block 140. Each chunk may have its own address within the address range. As a result, processor 115 can provide each chunk on PCIe communications interface 130 with an address within the address range used by IP block 140.

Accordingly, at block 220, the selected partial reconfiguration bitstream can be provided to PLD 110 to reconfigure reconfigurable region 150. For example, IP block 140 can retrieve the 32 bits of the bitstream and provide 32 bits of the selected bitstream to control block 145 from its address range on PCIe communications interface 130. In some implementations, PCIe endpoint 125b can include memory which stores the provided chunks of the bitstream at the addresses, and IP block 140 can retrieve the chunks by requesting or obtaining the data in the addresses within its address range.

In some implementations, PCIe communications interface 130 might use a data width different than 32 bits. As a result, host device 105 might package the 32 bits into a larger "package" or packet, such as 512 bits. IP block 140 can then extract the relevant 32 bits out of the 512 bits to provide to control block 140. IP block 140 can provide 32 bit chunks of the selected partial reconfiguration bitstream to control block 145. Control block 145 can reconfigure reconfigurable region 150 by 32 configuration elements at a time (e.g., serially, in parallel, etc.). That is, control block 145 can receive 32 bit chunks of a partial reconfiguration bitstream and reconfigure a portion of reconfigurable region 150 based on the 32 bit chunks. Accordingly, host device 105 can provide each 32 bit chunk of a partial reconfiguration bitstream, IP block 140 can retrieve each of the 32 bit chunks, and provide each of the 32 bit chunks to control block 145, which can reconfigure reconfigurable region 150. The freeze flag can be de-asserted after the full partial reconfiguration bitstream has been received and used by control block 145 to reconfigure reconfigurable region 150.

Figure 3:
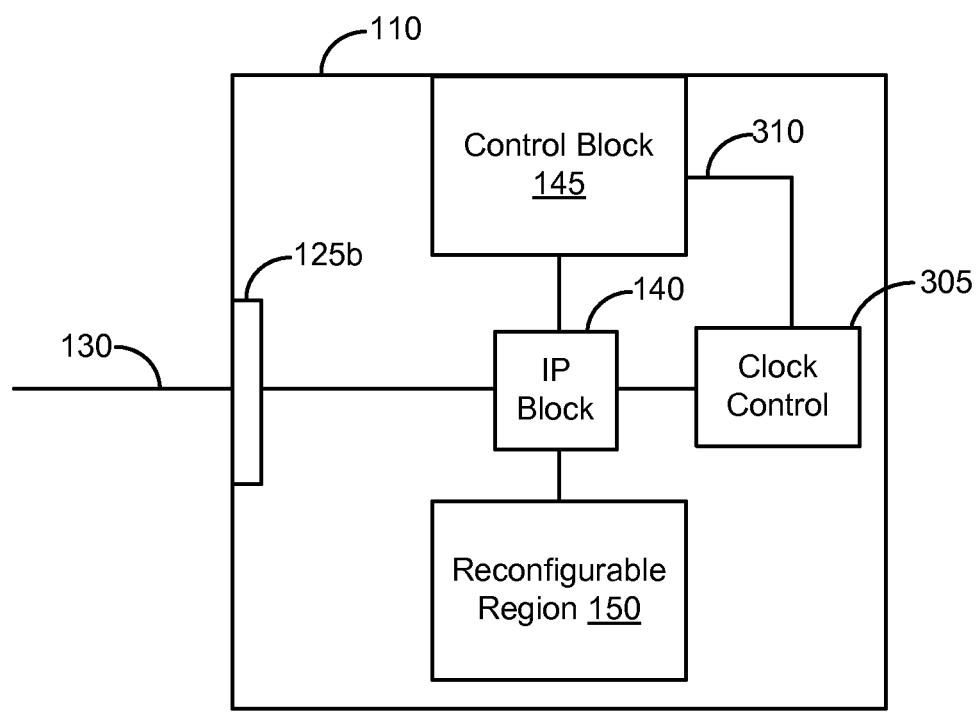
FIG. 3 illustrates an example of adjusting a clock signal for partial reconfiguration in accordance with some implementations.

In some implementations, IP block 145 can also adjust a clock signal provided to control block 145 based on the selected partial reconfiguration bit stream being provided by host device 105. FIG. 3 illustrates an example of adjusting a clock signal for partial reconfiguration in accordance with some implementations. In FIG. 3, IP block 140 of PLD 110 can adjust clock signal 310 used by control block 145 via clock control logic 305.

In some implementations, clock signal 310 used by control block 145 should sample each chunk of the bitstream retrieved and provided by IP block 140 once per clock cycle so that it receives the proper data from the chunk of the bitstream to reconfigure the reconfigurable region. However, the data provided at PCIe communications interface 130 for IP block 140 can be provided at varying rates since other components of system 100 might be using the same PCIe communications interface 130 at times, resulting in the possibility of control block 145 sampling (or clocking) the same chunk twice, or sampling at a rate such that a chunk can be missed. Accordingly, IP block 140 can assert a signal to slow down or pause clock signal 310 by providing the signal to clock control 305 when such a condition is recognized. For example, if the 32-bit chunks provided by host device 105 are being provided too slowly, then clock signal 310 can be slowed down (i.e., lowered in frequency or paused (e.g., via clock gating)). IP block 140 can determine the rate at which new data providing new chunks of the partial reconfiguration bitstream is being provided, for example, by determining when a prior chunk was received and when the next chunk is received and determine the frequency of the chunks being provided on PCIe communications interface 130, and therefore, adjust the frequency of clock signal 310 based on that frequency. By contrast, if the 32-bit chunks are provided quickly, clock signal 310 can be sped up (i.e. increase in frequency). Accordingly, if the detected frequency of the data (e.g., chunks) being provided on PCIe communications interface 130 is at a rate above or below a threshold frequency indicative of the frequency of clock signal 310 used by control block 145 to sample the bitstream data it is provided by IP block 140, IP block 140 can adjust frequency of clock signal 310 such that control block 145 samples each of the bits of each chunk of the partial reconfiguration bit streams properly.

Figure 4:
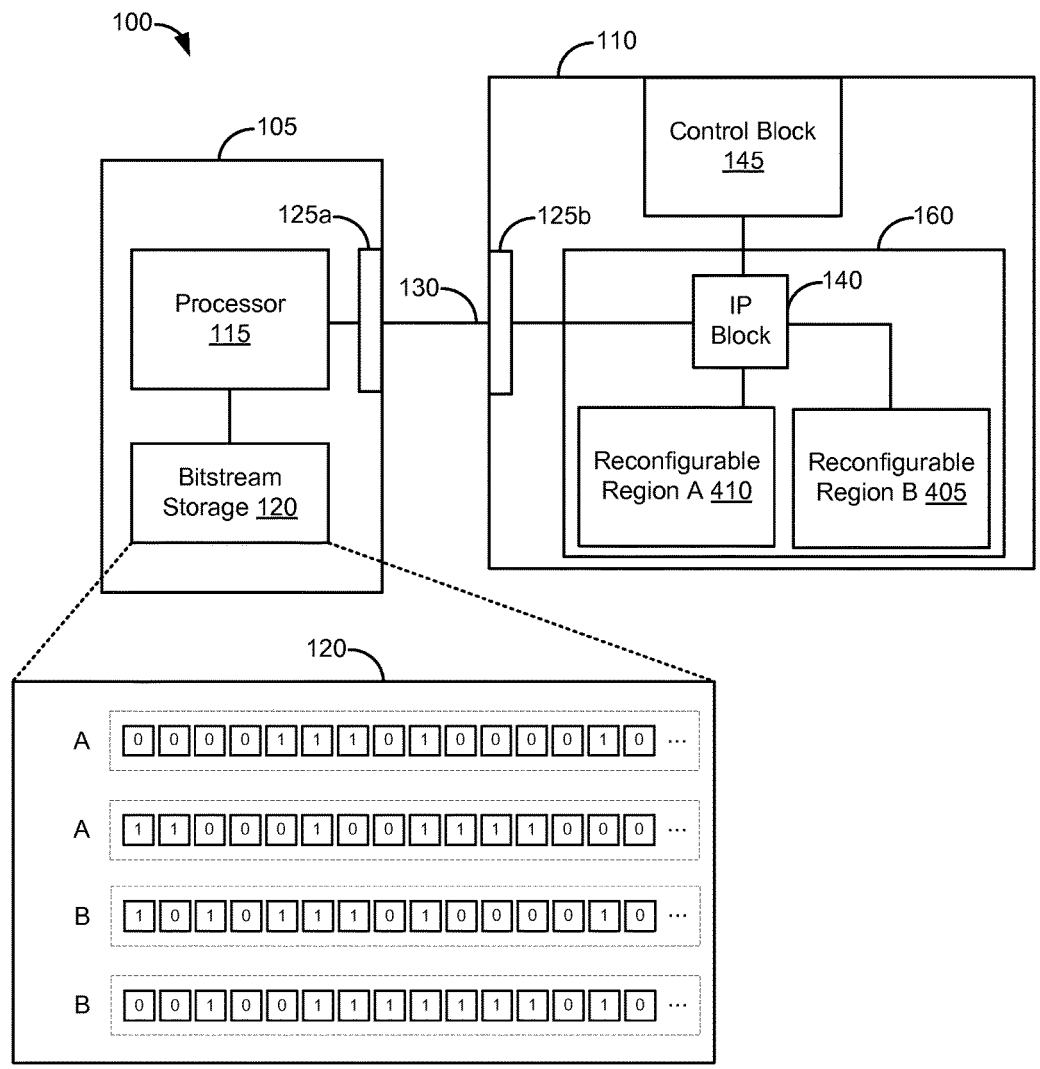
FIG. 4 illustrates an example of a system for partial reconfiguration of multiple regions in accordance with some implementations.

Though the previous examples show a single reconfigurable region 150, in other implementations, multiple reconfiguration regions can be implemented within configurable logic 160 and each may be partially reconfigured. FIG. 4 illustrates an example of a system for partial reconfiguration of multiple regions in accordance with some implementations. In FIG. 4, bitstream storage 120 stores multiple partial reconfiguration bitstreams for reconfigurable region A 410 and reconfigurable region B 405 implemented within configurable logic 160 of PLD 110 in FIG. 4. Each of the bitstreams stored in bitstream storage 120 can be associated with an identifier corresponding to one of the reconfigurable regions (i.e., reconfigurable region A 410 and B 405). For example, in FIG. 4, two bitstreams are labeled as being for reconfigurable region A 410 and the remaining two bitstreams are labeled as being for reconfigurable region B 405. When processor 115 selects one of the bitstreams from bitstream storage 120 to provide on PCIe communications interface 130 to IP block 140, it can also provide the corresponding identifier so that IP block 140 can know which of reconfigurable region A 410 or B 405 the incoming bitstream is for. As a result, IP block 140 can generate the freeze signal, as previously discussed, for the correct reconfigurable region and indicate to control block 145 which of the regions the bitstream is to reconfigure.

In some implementations, control block 145 can generate an error or status signal (or data) to be provided to host device 105 via IP block 140 and PCIe communications interface 130. For example, when control block 145 is finished with partially reconfiguring a reconfigurable region, it may generate a complete status signal, which can be provided to host device 105 so that it knows that the bitstream was properly provided. In some implementations, an error signal can be provided and host device 105 can reset the process and start over, providing the selected partial reconfiguration bitstream from the beginning again.

Figure 5:
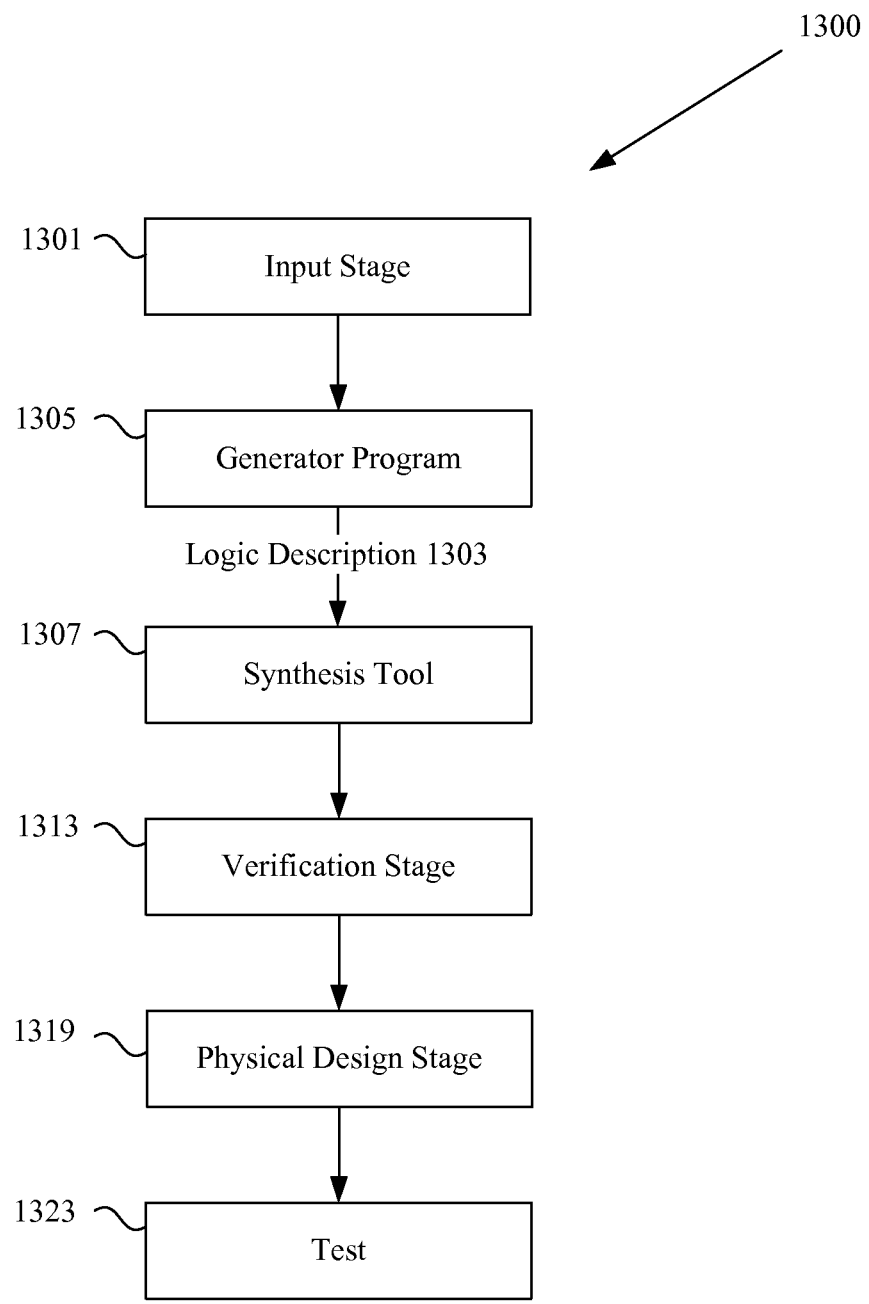
FIG. 5 illustrates a technique for implementing a programmable chip.

In some implementations, functionality disclosed herein may be implemented within a PLD, such as an FPGA. For example, IP block 140 and the functionality of reconfigurable regions can be implemented within configurable logic of a PLD, as previously discussed. FIG. 5 illustrates a technique 1300 for implementing a programmable chip. An input stage 1301 receives selection information typically from a user for logic such as a processor core as well as other components to be implemented on an electronic device. In one example, the input received is in the form of a high-level language program. A generator program 1305 creates a logic description 1303 and provides the logic description 1303 along with other customized logic to any of a variety of synthesis tools, place and route programs, and logic configuration tools to allow a logic description to be implemented on an electronic device.

In one example, an input stage 1301 often allows selection and parameterization of components to be used on an electronic device. The input stage 1301 also allows configuration of hard coded logic. In some examples, components provided to an input stage include intellectual property functions, megafunctions, and intellectual property cores. The input stage 1301 may be a graphical user interface using wizards for allowing efficient or convenient entry of information. The input stage may also be a text interface or a program reading a data file such as a spreadsheet, database table, or schematic to acquire selection information. The input stage 1301 produces an output containing information about the various modules selected. At this stage, the user may enter security information about individual components that needs to be isolated. For example, different levels of component security and which components are allowed to communicate with each other may be entered.

In typical implementations, the generator program 1305 can identify the selections and generate a logic description with information for implementing the various modules. The generator program 1305 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 1305 identifies pointers and provides ports for each pointer. One tool with generator program capabilities is System on a Programmable Chip (SOPC) Builder available from Altera Corporation of San Jose, Calif. The generator program 1305 also provides information to a synthesis tool 1306 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 1301, generator program 1305, and synthesis tool 1306 can be separate programs. The interface between the separate programs can be a database file, a log, or simply messages transmitted between the programs. For example, instead of writing a file to storage, the input stage 1301 can send messages directly to the generator program 1305 to allow the generator program to create a logic description. Similarly, the generator program can provide information directly to the synthesis tool instead of writing HDL files. Similarly, input stage 1301, generator program 1305, and synthesis tool 1306 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1306.

A synthesis tool 1306 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1313 typically follows the synthesis stage 1306. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1313, the synthesized netlist file can be provided to physical design tools 1319 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 1323.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 1301, the generator program 1305, the synthesis tool 1306, the verification tools 1313, and physical design tools 1319 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
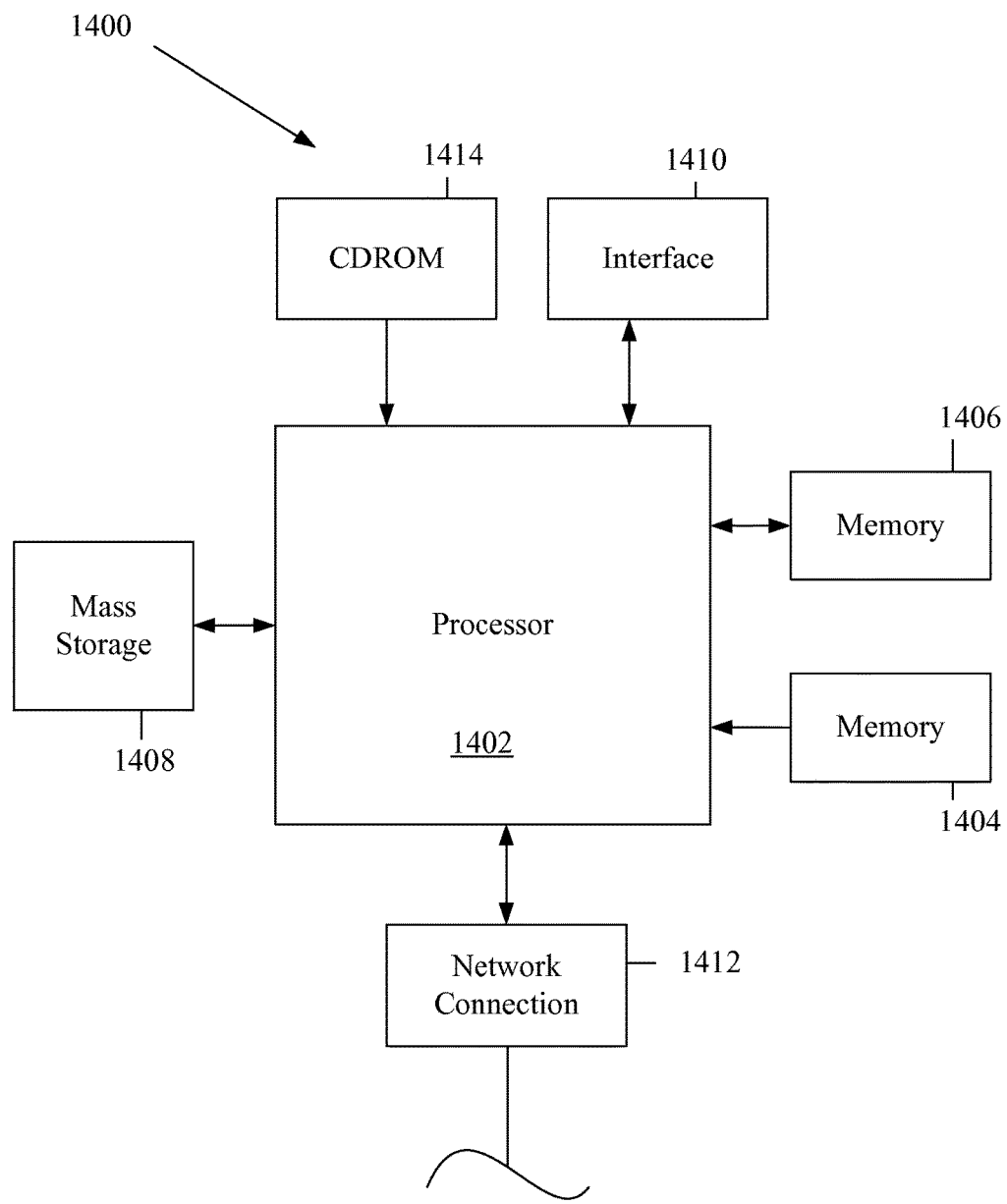
FIG. 6 illustrates one example of a computer system.

FIG. 6 illustrates one example of a computer system implementing the techniques disclosed herein. The computer system 1400 includes any number of processors 1402 (also referred to as central processing units, or CPUs) that are coupled to devices including memory 1406 (typically a random access memory, or "RAM") and memory 1404 (typically a read only memory, or "ROM"). The processors 1402 can be configured to generate an electronic design. As is well known in the art, memory 1404 acts to transfer data and instructions uni-directionally to the CPU and memory 1406 are used typically to transfer data and instructions in a bi-directional manner.

Both of these memory devices may include any suitable type of the computer-readable media described above. A mass storage device 1408 is also coupled bi-directionally to CPU 1402 and provides additional data storage capacity and may include any of the computer-readable media described above. The mass storage device 1408 may be used to store programs, data and the like and is typically a secondary storage medium such as a hard disk that is slower than memory. The mass storage device 1408 can be used to hold a library or database of prepackaged logic or intellectual property functions, as well as information on generating particular configurations. It will be appreciated that the information retained within the mass storage device 1408, may, in appropriate cases, be incorporated in standard fashion as part of memory 1406 as virtual memory. A specific mass storage device such as a CD-ROM 1414 may also pass data uni-directionally to the CPU.

CPU 1402 is also coupled to an interface 1410 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1402 may be a design tool processor. Finally, CPU 1402 optionally may be coupled to a computer or telecommunications network using a network connection as shown generally at 1412. With such a network connection, it is contemplated that the CPU might receive information from the network, or might output information to the network in the course of performing the above-described process steps. It should be noted that the system 1400 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques disclosed herein.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A bridge circuit of a programmable logic device (PLD) to:
   receive a first configuration data from a communications interface, the first configuration data indicating states of configurable elements of a region of configurable logic of the PLD to implement a first functionality, the bridge circuit to freeze inputs and outputs of the region of the configurable logic, and the bridge circuit to provide bits of the first configuration data to a control block of the PLD to configure the configurable elements after freezing the inputs and outputs.

2. The bridge circuit of claim 1, wherein the bridge circuit is to adjust a clock signal used by the control block based on a rate of the first configuration data being provided over the communications interface.

3. The bridge circuit of claim 1, wherein the communications interface conforms to a Peripheral Component Interconnect Express (PCIe) protocol.

4. The bridge circuit of claim 1, wherein the configurable elements indicated in the first configuration data correspond to a subset of configuration elements of the configurable logic of the PLD.

5. The bridge circuit of claim 1, wherein the bridge circuit is further to receive a second configuration data from the communications interface, the second configuration data indicating states of the configurable elements of the region to implement a second functionality.

6. The bridge circuit of claim 1, wherein the bridge circuit is further to provide an identifier corresponding to the region to the control block.

7. The bridge circuit of claim 1, wherein the bridge circuit is further to extract bits from the first configuration data to provide a partial reconfiguration bitstream corresponding to the configuration elements of the region to the control block.

8. The bridge circuit of claim 1, wherein the bridge circuit is further to receive status data from the control block and provide the status data on the communications interface to a host device.

9. A method for partial reconfiguration of a programmable logic device (PLD), the method comprising:
   receiving, by a bridge circuit of the PLD, from a communication interface providing communications between the PLD and a host device, an indication that a portion of configurable logic of the PLD is to be reconfigured;
   freezing, by the bridge circuit, inputs and outputs of the portion of the configurable logic of the PLD;
   receiving, by the bridge circuit, data providing a partial reconfiguration bitstream for the portion of the configurable logic of the PLD that is to be reconfigured; and
   providing, by the bridge circuit, the partial reconfiguration bitstream for the portion of the configurable logic of the PLD to a control block for reconfiguring the portion of the configurable logic.

10. The method of claim 9, further comprising:
    reconfiguring configurable elements of the portion of the configurable logic of the PLD based on the partial reconfiguration bitstream.

11. The method of claim 10, wherein the configurable elements indicated in the partial reconfiguration bitstream correspond to a subset of configuration elements of the configurable logic of the PLD.

12. The method of claim 9, further comprising:
    adjusting a frequency of a clock signal used by the control block based on a rate of receiving the data providing the partial reconfiguration bitstream.

13. The method of claim 9, wherein the communications interface conforms to a Peripheral Component Interconnect Express (PCIe) protocol.

14. The method of claim 9, further comprising:
    extracting bits from the data to provide the partial reconfiguration bitstream.

15. A system comprising:
    a bridge circuit to receive configuration data from a host device, the configuration data indicating states of configurable elements of a region of configurable logic to implement a first functionality, the bridge circuit to freeze inputs and outputs of the region of the configurable logic, and
    a control circuit to receive a bitstream from the configuration data to configure the configurable elements of the region, bits in the bitstream corresponding to the states of the configuration elements of the region of the configurable logic.

16. The system of claim 15, wherein the bridge circuit is to adjust a clock signal used by the control circuit based on a rate of the configuration data being received.

17. The system of claim 15, wherein the configurable elements indicated in the configuration data correspond to a subset of configuration elements of the configurable logic of a PLD including the bridge circuit and the control circuit.

18. The system of claim 15, wherein the bridge circuit communicates with the host device with a communications interface conforming to a Peripheral Component Interconnect Express (PCIe) protocol.

19. The system of claim 18, wherein the bridge circuit is further to receive status data from the control circuit and provide the status data on the communications interface to the host device.

20. The system of claim 15, wherein the bridge circuit is further to provide an identifier corresponding to the region to the control circuit.

* * * * *